United States Patent [19]

Holland et al.

[11] Patent Number: 5,661,044

[45] Date of Patent: Aug. 26, 1997

[54] PROCESSING METHOD FOR FORMING DISLOCATION-FREE SOI AND OTHER MATERIALS FOR SEMICONDUCTOR USE

[75] Inventors: Orin Wayne Holland, Oak Ridge; Darrell Keith Thomas, Kingston, both of Tenn.; Dashun Zhou, Sunnyvale, Calif.

[73] Assignee: Lockheed Martin Energy Systems, Inc., Oak Ridge, Tenn.

[21] Appl. No.: 490,658

[22] Filed: Jun. 15, 1995

Related U.S. Application Data

[63] Continuation-in-part of Ser. No. 157,559, Nov. 24, 1993, abandoned.

[51] Int. Cl.$^6$ ............................................. H01L 21/265
[52] U.S. Cl. ........................................ 438/766; 438/938
[58] Field of Search ................................. 437/24, 26, 27, 437/976, 933, 62

[56] References Cited

U.S. PATENT DOCUMENTS

| | | | |
|---|---|---|---|
| 4,769,660 | 9/1988 | Short et al. | 437/24 |
| 4,786,608 | 11/1988 | Griffith et al. | 437/24 |
| 4,800,170 | 1/1989 | Jain et al. | 437/24 |
| 4,962,051 | 10/1990 | Liaw | 437/976 |
| 4,975,126 | 12/1990 | Margail et al. | 437/24 |
| 5,080,730 | 1/1992 | Wittkower | 437/24 |
| 5,143,858 | 9/1992 | Tomozane et al | 437/24 |
| 5,185,273 | 2/1993 | Jasper | 437/24 |
| 5,196,355 | 3/1993 | Wittkower | 437/24 |
| 5,236,872 | 8/1993 | van Ommen et al. | 437/24 |
| 5,288,650 | 2/1994 | Sandow | 437/24 |

OTHER PUBLICATIONS

HH Hosack et al, "SIMOX Silicon–on–Insulator:Materials and Devices Solid State Technology" Dec. 1990, pp. 61–66.
Michael A. Guerra. "The Status of SIMOX Technology"Solid State Technology, Nov. 1990, pp. 75–78.
Hemment et al, "Nucleation and Growth of SiO$_2$ Precipitates.. " Instruments and Methods in Physics Research, B39(1989)pp. 210–216.

*Primary Examiner*—Tom Thomas
*Assistant Examiner*—S. Mulpuri
*Attorney, Agent, or Firm*—Michael E. McKee; Harold W. Adams

[57] ABSTRACT

A method for preparing a silicon-on-insulator material having a relatively defect-free Si overlayer involves the implanting of oxygen ions within a silicon body and the interruption of the oxygen-implanting step to implant Si ions within the silicon body. The implanting of the oxygen ions develops an oxide layer beneath the surface of the silicon body, and the Si ions introduced by the Si ion-implanting step relieves strain which is developed in the Si overlayer during the implanting step without the need for any intervening annealing step. By relieving the strain in this manner, the likelihood of the formation of strain-induced defects in the Si overlayer is reduced. In addition, the method can be carried out at lower processing temperatures than have heretofore been used with SIMOX processes of the prior art. The principles of the invention can also be used to relieve negative strain which has been induced in a silicon body of relatively ordered lattice structure.

15 Claims, 4 Drawing Sheets

PROCESSING METHOD FOR FORMING DISLOCATION-FREE SOI AND OTHER MATERIALS FOR SEMICONDUCTOR USE

BACKGROUND OF THE INVENTION

This is a continuation-in-part of application Ser. No. 08/157,559, filed Nov. 24, 1993 and now abandoned, the disclosure of which is incorporated herein by reference.

This invention relates generally to the making of semiconductors and relates, more particularly, to the preparation of silicon-on-insulator (SOI) materials for use in semiconductor applications.

As the dimensions of various components of integrated circuits (IC) continue to decrease, electrical isolation of the various components on bulk silicon (Si) becomes increasingly difficult. The structure of silicon-on-insulator (SOI) material, consisting of a thin Si layer at the surface, a bulk amount (or thicker layer) of Si and a stoichiometric oxide layer (or other insulative layer) interposed between so as to isolate the thin Si layer and the bulk Si, is well-suited for providing both vertical and lateral isolation. Moreover and in the case of SOI materials which utilize a layer of oxide, this vertical and lateral isolation is achieved with the elimination of such parasitic effects as device latchup in complementary metal-oxide-semiconductor (CMOS) circuits. In addition, ICs fabricated in this material are radiation-hard, thus rendering this material well-suited for many military applications. For these reasons, as well as a host of others, SOI is considered to be the future starting material for Si-based ICs.

There are several candidates for SOI material including silicon-on-sapphire (SOS) and silicon on oxide ($SiO_2$). SOS material can be fabricated by growing single-crystal silicon epitaxially on sapphire. However, SOS material is not widely used because it is quite defective and suffers from autodoping problems, e.g. migration of Al from the sapphire substrate into the overlying Si. Silicon-on-oxide circumvents the autodoping problem and can be fabricated by several techniques. A leading technique which has been commercialized is a technique known as separation by implantation of oxygen (SIMOX). The SIMOX method of forming SOI involves the implanting of single-crystal Si with doses of oxygen ions sufficiently high to form a stoichiometric oxide layer buried beneath the surface. One key to effective SIMOX processing is that implantation conditions be adjusted during the process to minimize defect formation in the overlayer during implantation so that subsequent high-temperature annealing (generally exceeding 1300° C.) is effective in lowering defect densities to acceptable levels, as well as yielding a smooth surface topography. By comparison, the temperature of the silicon body, or wafer, within which implantation steps are carried out during a SIMOX process is commonly maintained at an elevated temperature within the range of 400° C. to 600° C. It will be understood, therefore, that the temperatures during which SIMOX implantation is carried out differ markedly from the temperatures involved during high-temperature annealing.

Heretofore, SIMOX art forms include two variations. The first is simply to implant a single crystal Si wafer with the entire dose of oxygen ions continuously at a given energy (typically, no less than 200 keV) while maintaining the Si wafer at an elevated temperature. As mentioned above, this elevated temperature is commonly in the range of 400° C. to 600° C. and is intended to suppress damage formation in the Si overlayer. Following implantation, the wafer is annealed in an inert ambient at a high temperature of no less than about 1300° C. for several hours. This annealing step is intended to remove much of the ion-induced damage and to form a continuous buried oxide layer with smooth planar interfaces. The dislocation density of the resulting wafer is generally no less than $10^5$ $cm^{-2}$.

In the second variation of the SIMOX process, the oxygen ions are implanted in multiple cycles, rather than a single continuous step, at an elevated temperature and at a constant ion energy. Following each implanting step, the wafer is annealed at a high temperature, i.e. no less than about 1300° C., to yield a product having a dislocation density of about $10^3$ $cm^{-2}$.

It is an object of the present invention to provide a new and improved method for preparing SOI materials wherein the Si overlayer is less defective than is the overlayer of similar materials prepared by conventional processes.

Another object of the present invention is to provide such a method wherein the formation of extended defects (such as dislocations) which are commonly developed during high-dose oxygen implantation of Si is suppressed.

Still another object of the present invention is to provide such a method which yields an essentially dislocation-free Si layer ahead of the buried oxide at arbitrarily large implantation doses.

Yet another object of the present invention is to provide such a method which enables the Si substrate to be maintained at temperatures during the process which are lower than temperatures commonly used by the prior art.

One more object of the present invention is to provide such a method which involves multiple implantation cycles without the use of any intervening annealing step.

A further object of the present invention is to provide such a method which permits the temperature of any post-implantation anneal to be reduced.

SUMMARY OF THE INVENTION

This invention resides in a method for relieving negative strain induced in a silicon body of relatively ordered lattice structure. The method includes the step of implanting the silicon body with Si self-ions.

In a particular embodiment of the method (for preparing a material for use in a semiconductor application), the method includes the steps of providing a body of silicon having an ordered lattice structure and at an elevated temperature and implanting synthesized layer forming (SLF) ions at a first dose within the silicon body to develop an ion-beam synthesized layer beneath the surface of the silicon body wherein the implantation of the SLF ions induce negative strain beneath the surface of the silicon body. The silicon body is also implanted with Si ions following or simultaneously with the SLF-implanting step without an intervening annealing step and at a lower dose than that of the first dose while the silicon body is at the elevated temperature to relieve the strain which is induced therein and halting the Si implanting step after an induced strain in the Si overlayer has been relieved.

DETAILED DESCRIPTION OF AN ILLUSTRATIVE EMBODIMENT

Techniques used in the separation by implantation of oxygen (SIMOX) are used to implant oxygen (or other) ions, as well as silicon ions, within silicon in the method of the invention. The mechanics of such techniques are well known so that a detailed description thereof is not believed to be necessary. Suffice it to say that the desired ion, e.g. oxygen or silicon, are extracted from a suitable ion source, magnetically analyzed, and accelerated toward a target or, in this case, a silicon wafer. The energy possessed by the ions moving toward the target correlates directly with the velocity of the ions so that the greater the ion energy, the greater the velocity of the ions.

A purpose served by the implantation of preselected ions, such as oxygen ions, within the body of silicon is to develop an ion-beam synthesized oxide layer below the surface of the silicon body. Although the process embodiment described herein utilizes oxygen ions to develop an insulative (oxide) layer within the silicon body, other ions, such as nitrogen (for the development of a buried insulator of $Si_3N_4$) or cobalt (for the development of a buried conductive layer of $CoSi_2$) can be used. Accordingly, the principles of the present invention can be variously applied.

In the interests of the present invention, damage accumulation in the silicon is defined as the formation of extended defects, such as dislocations, within the crystalline lattice of the silicon structure. By utilizing the techniques of the method described herein, better control of the near-surface morphology in the silicon wafer can be realized so that the resultant SOI product has a silicon overlayer (ahead of the buried oxide) which is substantially defect-free.

In an exemplary process of the method of this invention, a silicon (Si) body having an ordered lattice structure, e.g. a single crystal of Si, is implanted with sufficiently high doses of oxygen ions to form a buried oxide layer while an almost defect-free Si overlayer is maintained during the implanting steps. To understand how this can be accomplished, it is helpful to identify the mechanism responsible for the formation of dislocations in the Si overlayer.

Figure 1A:
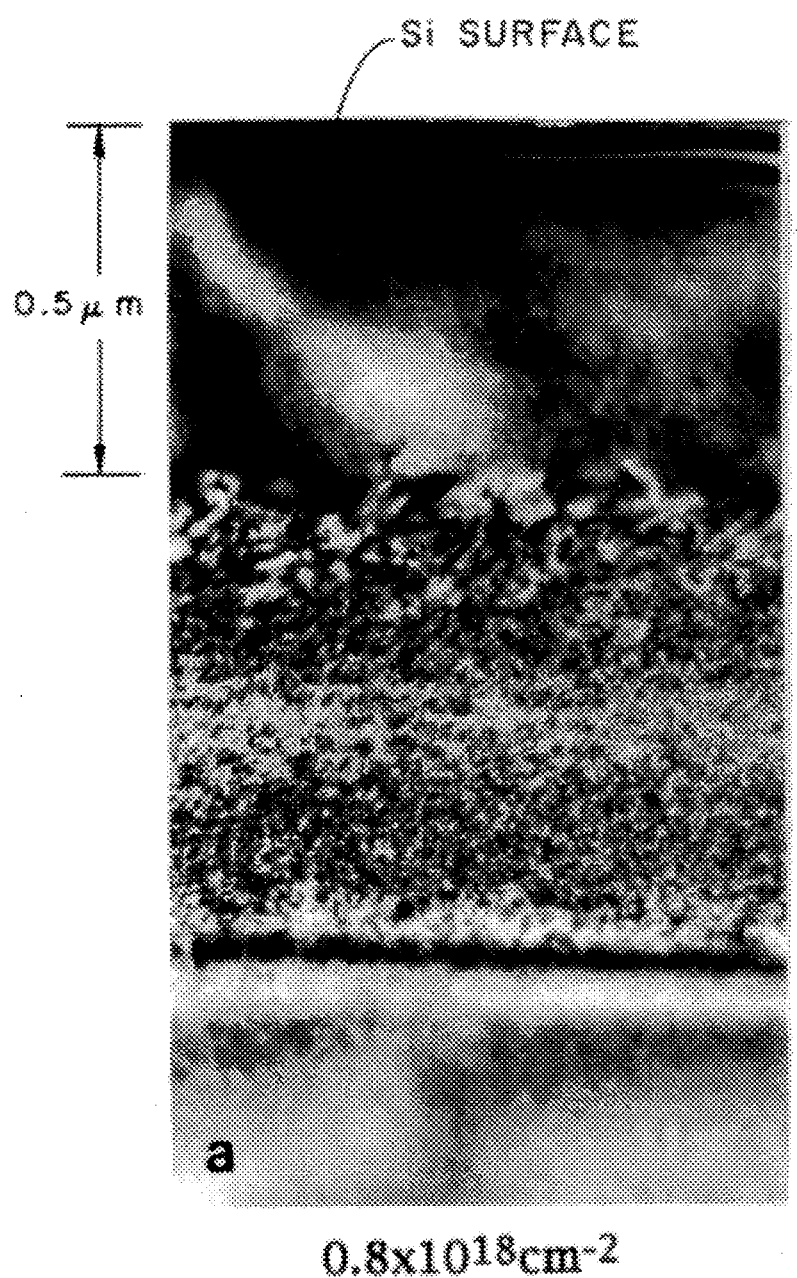
FIG. 1a is a transmission electron micrograph (TEM) depicting a cross-sectional image of an Si wafer which has been implanted at 450° C. with 450 keV $O^+$-ions at a fluence of $0.8 \times 10^{18}$ $cm^{-2}$.
Figure 1B:
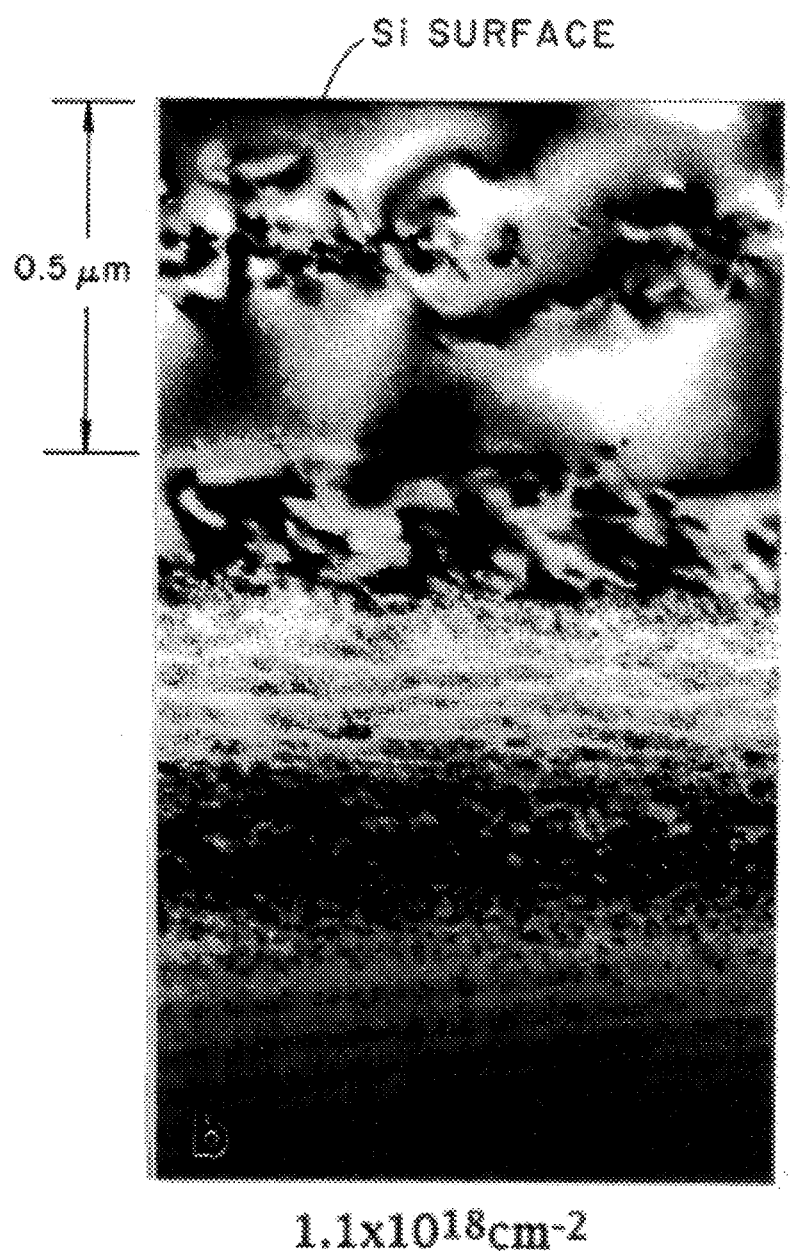
FIG. 1b is a transmission electron micrograph (TEM) depicting a cross-sectional image of an Si wafer Which has been implanted at 450° C. with 450 keV O$^+$-ions at a fluence of $1.1 \times 10^{18}$ cm$^{-2}$.
Figure 1C:
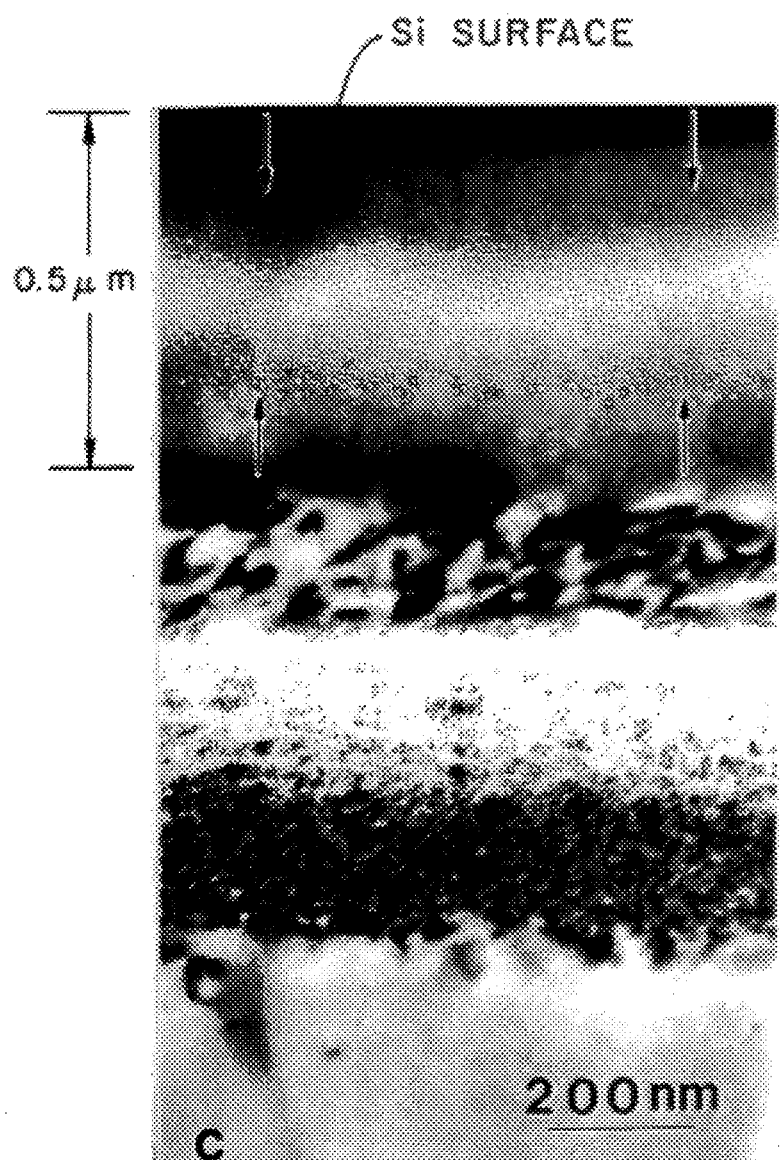
FIG. 1c is a TEM depicting a cross-sectional image of the wafer of FIG. 1a after it has been annealed at 900° C. for 1 hour.

In this connection, dislocations have been observed in the top Si layer ahead of the buried oxide only beyond a critical dose. This situation is clearly illustrated in transmission electron micrographs (TEM) in FIG. 1, which show cross-sectional images of Si images implanted at 450° C. with 450 keV O$^+$-ions at two different fluences: (a) $0.8 \times 10^{18}$ cm$^{-2}$ and (b) $1.1 \times 10^{18}$ cm$^{-2}$. It can be noticed in FIG. 1a that the top Si layer extending over about 0.5 μm is free of any extended defects. This is in contrast to FIG. 1(b), which clearly shows that dislocations are present at the higher dose, having formed into a distinct band in the Si overlayer. Once formed, dislocations multiply rapidly during continued irradiation so that the entire top Si layer is completely filled with a dense network of dislocations.

X-ray diffraction measurements show that there is a large negative strain within the top Si layer at the lower dose which is not present at the higher dose. The lattice concentration at the lower fluence is attributed to an accumulation of vacancy-type defects within the Si overlayer during irradiation. Evidence for these defects is provided in the micrograph of FIG. 1c obtained from the $0.8 \times 10^{18}$ cm$^{-2}$ implanted sample (of FIG. 1a) after thermal annealing at 900° C. for 1 hour. Thermal cycling at this temperature causes the vacancy-type defects to coalesce into much larger clusters, i.e. voids, which can be clearly seen with a microscope. The voids are located over a range similar to the dislocation band in FIG. 1b. This spatial correlation, as well as the absence of negative strain in the presence of dislocations, strongly suggest that dislocations are formed by a strain relief mechanism. It is envisioned that the buildup of negative strain during irradiation leads to dislocation formation when the yield point of the lattice is exceeded.

Since the lattice strain which gives rise to the aforediscussed damage is localized, it is possible to intervene prior to the yield point with a spatial specific probe to either relieve or reduce the strain and thus avoid dislocation formation. Preliminary experiments indicate that it is possible to effect this reduction in strain with a Si$^+$, self-ion beam with an energy chosen to place the ions within the strained layer. The implanted Si ions occupy the vacant lattice sites thus removing the source of the lattice strain so that subsequent oxygen implantation can proceed to a much higher dose before reaching the yield point of the lattice.

Figure 2:
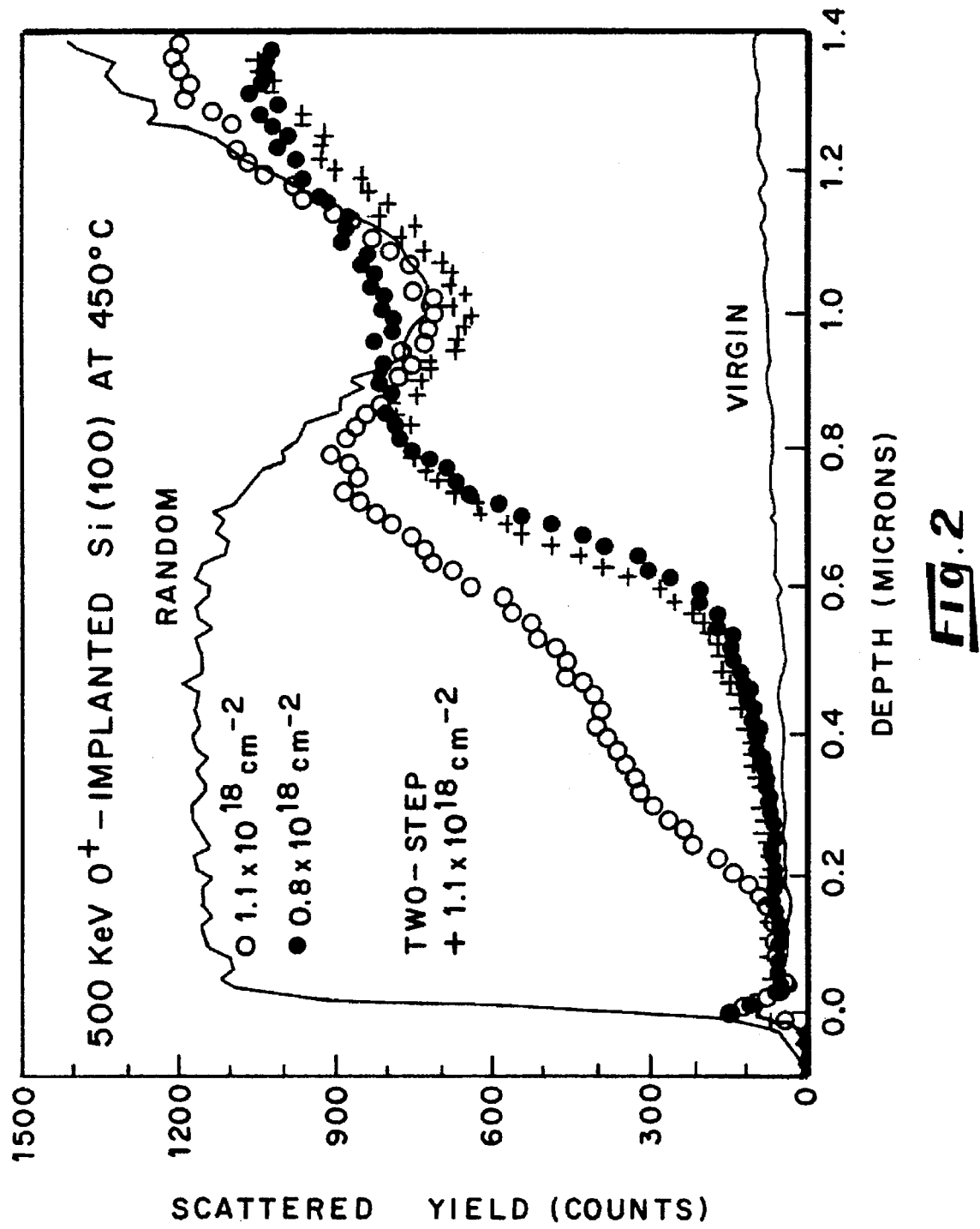
FIG. 2 is a graph depicting ion channeling data obtained with Si samples implanted at 450° C. with 500 keV oxygen ions with various fluences.

The following data substantiate these claims. With reference to FIG. 2, there is shown ion channeling results from Si samples implanted at 450° C. with 500 keV oxygen ions under different conditions. A qualitative interpretation of these spectra requires only an examination of the aligned yield at a given depth, which reflects the cumulative damage in the lattice over this range. Attention can be focused on the scattering yield from the Si overlayer extending to about 0.5 μm. Only a small increase in the scattering yield (compared to the virgin yield) is seen in this range from the Si crystal implanted at a dose of $0.8 \times 10^{18}$ cm$^{-2}$, thus indicating the presence of little damage in this range. Such results are consistent with the results in FIG. 1a which also show this region to be substantially dislocation-free. The large increase in the scattering yield at the higher dose of $1.1 \times 10^{18}$ cm$^{-2}$ reflects significant damage growth in the Si overlayer in this fluence range as previously seen in FIG. 1b.

With reference still to FIG. 2, the third spectrum of data is collected from a sample implanted at the higher dose, but in two steps. In the first step, oxygen implantation is interrupted at a fluence of $0.8 \times 10^{18}$ cm$^{-2}$ to irradiate the sample with Si$^+$ self-ions ($2 \times 10^{15}$ cm$^{-2}$, 150 keV) to implant Si$^+$ self-ions within the sample. This was followed by a second oxygen implantation ($0.3 \times 10^{18}$ cm$^{-2}$) to achieve a total fluence of $1.1 \times 10^{18}$ cm$^{-2}$. The temperature of the sample during each implanting step was about 450° C., and no high temperature annealing was performed upon the samples between implanting steps. The aligned yield from this sample is seen to be much lower than in the one implanted to the same dose but in a single step. The lower scattering yield from this sample clearly demonstrates the ability of self-ion irradiation to effectively reduce strain and, therefore, suppress dislocation formation at high oxygen fluences without the use of any intervening high temperature annealing step between the implanting steps.

Experiments can be performed to optimize processing conditions for a given implant (oxygen or silicon) dose. Experiments performed to date indicate that processing conditions are highly dependant upon such factors as the temperature of the Si substrate, the ion dose rate, the processing current and even the history of the sample. Thus, there does not exist a single ion dosage which would provide ideal results in every SOI-fabrication process.

It should be noted, however, that applicants have experimentally confirmed that unless the conditions of an ion-implantation process are appropriately controlled, a threshold of damage accumulation in the Si overlayer could be exceeded so that the resulting SOI product would possess an unacceptably-high defect concentration. Applicants have addressed this matter in co-pending U.S. patent application Ser. No. 08/113,389, filed Aug. 27, 1993 and whose disclosure is incorporated herein by reference. Therefore, in the processing steps of the instant invention involving the implanting of oxygen within the silicon body, the oxygen-implanting conditions are preferably controlled so that the threshold of damage accumulation in the Si overlayer is not exceeded.

Along the same lines, care should be taken with regard to the length of time that the oxygen ions are implanted during each implanting step (before the oxygen-implanting step is interrupted for the purpose of carrying out a silicon-implanting step) so that the buildup of ion-induced strain in the Si overlayer does not exceed the yield point of the lattice, i.e. the point at which dislocations form.

As mentioned earlier, the Si ions which are implanted within the silicon body during the aforediscussed irradiating steps are intended to occupy vacant lattice sites created within the Si overlayer during the preceding oxygen-implanting step. Therefore, it is preferred that the processing conditions for the irradiating step be controlled so that each vacant lattice site is filled by a corresponding Si ion. If too many Si ions are implanted in the overlayer during an irradiating step, dislocations tend to nucleate (an undesirable consequence). Thus, there exists optimum processing conditions for a given Si-implanting dose and a preferred length of time, i.e. dose, that each Si ion-irradiating step is conducted before the irradiating step is halted and a subsequent oxygen-implanting dose is initiated.

Another advantage of the invention described herein relates to the utilization of substrate heating during implantation of the oxygen ions. In this regard, the SIMOX fabrication techniques of the prior art use external heating of the Si wafers during implantation to suppress damage formation. The substrate onto which the wafers are mounted are generally maintained at an elevated temperature, i.e. in the range of 400°–600° C. While the data presented in FIG. 2 was gathered while the Si wafer was maintained at temperature within this range, i.e. 450° C., we have shown that damage can be suppressed at much lower temperatures (including ambient). This invention offers the possibility that, not only can defect-free SOI be produced but it can be produced at temperatures significantly lower than those previously used during implanting steps.

Still another advantage of the invention is that it can allow the temperature of the post-implantation anneal to be reduced. Even if damage removal is not a consideration, a post-implantation anneal is necessary to dissolve isolated oxide precipitates which are distributed over the entire range of the ions and to sharpen the interfacial regions of the buried oxide and render them more planar.

It follows from the foregoing that a method for preparing silicon-on-insulator material has been described wherein the material prepared thereby is less defective than SOI materials which have been heretofore attainable, and in the instances in which the method involves multiple implantation cycles, no intervening (high-temperature) annealing step is employed. More specifically, the method involving multiple implantation cycles includes a step of implanting Si ions within the silicon body to relieve the negative strain induced by ions implanted in a preceding implanting step without the use of an intervening annealing step. Thus, the implanting of Si ions in accordance with the multiple cycle method described herein is essentially a surgical technique to repair damage produced by a preceding (implantation) beam of ions and is necessary to prevent the damage, i.e. defect clusters, produced by the preceding ion beam from evolving into a more deleterious defect morphology, i.e. dislocations, during subsequent $O^+$ irradiations. Thus, the purpose served by the implanting of additional (non-Si) ions is to further develop the ion-beam synthesized layer (to, for example, a desired thickness), while the purpose served by the additional Si-implanting step is to relieve strain induced by the preceding ion-implanting dose to thereby render the Si overlayer of the resulting product as near perfect as is possible.

Furthermore, a significant feature of the aforedescribed multiple cycle technique relates to the halting of the Si implanting step after an appreciable amount of the induced strain has been relieved and before damage, such as dislocations, in the Si begins to nucleate. By halting the Si implanting step upon reaching these conditions, the relatively ordered lattice structure of the Si overlayer is preserved so that during subsequent oxygen implanting steps, the formation of dislocations in the Si overlayer is suppressed. Thus, the invention described herein leads to an improvement in the quality of the Si overlayer by reducing the density of dislocations formed within this region during subsequent oxygen implantation, and is further advantageous in this respect.

Moreover, the method can be carried out at a much lower processing temperature that can be achieved by the previous art. By reducing the dislocation density of SIMOX wafers prepared with the process, the possibility of large scale BiCMOS applications is likely to open up.

It will be understood that numerous modifications and substitutions can be had to the aforedescribed embodiment without departing from the spirit of the invention. For example, although the aforedescribed process has been described as including oxygen-implanting steps and silicon-implanting steps which are performed in a sequential fashion, with the proper equipment at hand, e.g. means for simultaneously directing two ion beams toward a silicon wafer, an oxygen-implanting step and a silicon-implanting step can be performed simultaneously. In such an instance, the dose rate of the Si ions is appreciably lower than that of the oxygen ions so that the rate at which the ion-induced strains are relieved by the implanted Si ions corresponds generally with the rate at which the ion-induced strains are created by the implanted oxygen ions.

Furthermore, the occurrence of strain-induced dislocations in the Si overlayer (ahead of the end-of-range of the ion) has been demonstrated with ions other than oxygen ions. Thus, it is believed that the mechanism for inducing such dislocations is independent of ion-solid chemistry and that the aforedescribed technique to suppress dislocations, i.e. by $Si^+$ self-ion irradiation, is equally effective for situations in which buried layers are formed in silicon by implantation of ions other than oxygen ions. Examples of processes which involve the implantation of ions other than oxygen ions include, but are not limited to, the formation of a buried insulator ($Si_3N_4$) by nitrogen ion implantation and the formation of a buried silicide by the implantation of an appropriate metal ion, such as the implanting of Co to form a buried layer of $CoSi_2$, or to the implanting of a combination of SLF ions.

Further still and in accordance with the broader aspects of the present invention, negative strain which has been induced within a silicon body by the implantation of any ions, even silicon ions, e.g. at a relatively high energy, can be relieved by the implantation (either simultaneously with or subsequent to the aforementioned silicon-implanting step) of silicon ions at a lower energy.

Accordingly, the aforedescribed embodiment is intended for the purpose of illustration and not as limitation.

We claim:

1. A method for relieving negative strain induced within a silicon body having a relatively ordered lattice structure and wherein the silicon body is at an elevated temperature of between about 400° and 600° C., the method comprising the steps of:

implanting Si ions within the silicon body silicon while the silicon body is at the elevated temperature and halting the Si implanting step after the induced strain within the silicon body has been relieved and before dislocations in the silicon begin to nucleate, wherein the Si ion implanting step is carried out in conjunction with an ion implanting step used to develop an ion-beam synthesized layer within the silicon body wherein negative strain within the silicon body is induced by the implantation therein of the synthesized layer-forming ion or a combination of synthesized layer-forming ions and wherein the Si ion implanting step is performed with no intervening annealing step preceding the Si ion implanting step.

2. A method of preparing a material for use in a semiconductor application, the method including the steps of:

providing a body of silicon having an ordered lattice structure and at an elevated temperature;

implanting synthesized layer-forming (SLF) ions at a first dose within the silicon body while the silicon body is at the elevated temperature wherein the implantation of the SLF ions induce negative strain beneath the surface of the silicon body; and implanting Si ions within the silicon body following or simultaneously with the SLF-implanting step without an intervening annealing step and at a lower dose than the first dose while the silicon body is at the elevated temperature to relieve the strain which is induced therein and halting the Si implanting step after an induced strain in the Si overlayer has been relieved and before dislocations in the Si overlayer begin to nucleate.

3. The method as defined in claim 2 wherein the step of implanting the SLF ions effects the development of an ion-beam synthesized layer beneath the surface of the silicon body and induces a negative strain in the Si overlayer.

4. The method as defined in claim 2 wherein the step of implanting the SLF ions and the step of implanting the Si ions are conducted in a sequential fashion wherein the step of implanting Si ions follows the step of implanting the SLF ions.

5. The method as defined in claim 4 wherein the step of implanting the SLF ions and the step of implanting the Si ions comprise one cycle of the method and the method further includes either repetition of the steps of the one cycle or the repetition of the step of implanting the SLF ions, as necessary, until the ion-beam synthesized layer has been developed to a desired thickness.

6. A method for preparing a material for use in a semiconductor application comprising the steps of:

providing a body of silicon having an ordered lattice structure and at an elevated temperature;

implanting synthesized layer-forming (SLF) ions at a first dose within the silicon body while the silicon body is at the elevated temperature to develop an ion-beam synthesized layer beneath the surface of the silicon body;

implanting Si ions within the silicon body following or simultaneously with the SLF-implanting step without an intervening annealing step and at a lower dose than the first dose while the silicon body is at the elevated temperature to relieve strain which is induced in the Si overlayer during the implanting step involving the SLF ions and halting the Si implanting step after induced strain in the Si overlayer has been relieved and before dislocations in the Si overlayer begin to nucleate; and the silicon-implanting step is followed by a second step of implanting SLF ions within the silicon body while the silicon body is at the elevated temperature to further develop the ion-beam synthesized layer beneath the surface of the silicon body.

7. The method as defined in claim 6 wherein each of the implanting steps involving the SLF ions is interrupted before the threshold of damage accumulation is exceeded in the Si overlayer.

8. The method as defined in claim 6 wherein each of the implanting steps involving the SLF ions is interrupted before dislocations are formed in the Si overlayer.

9. The method as defined in claim 6 wherein the second implanting step involving the SLF ions is followed by a second step of implanting Si ions within the silicon body to relieve strain which is induced in the Si overlayer during the second implanting step involving the SLF ions.

10. The method as defined in claim 9 wherein the implanting conditions during the implanting steps involving the SLF ions are controlled to reduce the likelihood of the formation of dislocations in the layer of silicon overlying the developed ion-beam synthesized layer, and each implanting step involving the SLF ions is interrupted before dislocations are formed in the Si overlayer.

11. The method as defined in claim 6 wherein the implanting step involving the SLF ions and the silicon-implanting step are performed simultaneously.

12. The method as defined in claim 6 wherein the SLF ions are oxygen ions.

13. A method for preparing a material for use in a semiconductor application comprising the steps of:

providing a body of silicon having an ordered lattice structure;

raising the temperature of the silicon body to an elevated level;

implanting synthesized layer-forming (SLF) ions at a first dose within the silicon body while the silicon body is at the elevated temperature in an implanting step to develop an insulative or conductive layer beneath the surface of the silicon body while controlling the conditions involving the SLF ions to reduce the likelihood of the formation of dislocations in the layer of silicon overlying the developed insulative or conductive layer; and implanting Si ions within the silicon body following or simultaneously with the SLF-implanting step without an intervening annealing step and at lower dose than the first dose while the silicon body is at the elevated temperature to relieve strain which develops in the Si overlayer during the implantation of the SLF ions.

14. The method as defined in claim 13 wherein the step of implanting SLF ions and the step of implanting Si ions are conducted in a sequential fashion wherein the step of implanting Si ions follows the step of implanting the SLF ions.

15. A method for preparing a silicon-on-insulator material, the method comprising the steps of:

providing a body of silicon at an elevated temperature;

implanting oxygen ions within the silicon body while the silicon body is at the elevated temperature in at least two stages wherein each oxygen-implanting stage is carried out at implantation conditions so as to develop an oxide layer within the silicon and so that the threshold level of dislocation formation is not exceeded during the implanting stages; and wherein the first of the two oxygen-implanting stages is carried out at a first dose and is followed by the second of the two oxygen-implanting stages which is preceded by a first Si implanting step of implanting the silicon body with Si ions while the silicon body is at the elevated temperature to relieve strain which develops in the Si overlayer during the first of the two stages and halting the Si implanting step after induced strain in the Si overlayer has been relieved and before dislocations in the Si begin to nucleate, and wherein a second Si ion implanting step is performed subsequent to the second of the two oxygen-implanting stages without a preceding annealing step.

* * * * *

UNITED STATES PATENT AND TRADEMARK OFFICE
CERTIFICATE OF CORRECTION

PATENT NO. : 5,661,044
DATED : August 26, 1997
INVENTOR(S) : Orin Wayne Holland et al It is certified that error appears in the above-indentified patent and that said Letters Patent is hereby corrected as shown below:

Column 1, between the title ending on line 3 and the heading "Background of the Invention" on line 5, the following paragraph should appear:

--This invention was made with Government support under Contract No. DE-AC05_96OR22464 awarded by the Office of Basic Energy Sciences Chemical Sciences Division of the U.S. Department of Energy to Lockheed Martin Energy Research Corporation, and the Government has certain rights in the invention.--

Signed and Sealed this

Ninth Day of February, 1999

Attest:

Attesting Officer

Acting Commissioner of Patents and Trademarks